(12) United States Patent
Yoshida

(10) Patent No.: US 7,443,498 B2
(45) Date of Patent: Oct. 28, 2008

(54) METHOD AND APPARATUS FOR INSPECTING A MURA DEFECT, AND METHOD OF MANUFACTURING A PHOTOMASK

(75) Inventor: Teruaki Yoshida, Kumamoto (JP)

(73) Assignee: Hoya Corporation, Tokyo (JP)

( * ) Notice: Subject to any disclaimer, the term of this patent is extended or adjusted under 35 U.S.C. 154(b) by 15 days.

(21) Appl. No.: 11/138,765

(22) Filed: May 27, 2005

(65) Prior Publication Data
US 2005/0271262 A1    Dec. 8, 2005

(30) Foreign Application Priority Data
May 28, 2004    (JP)    .................. P.2004-159792

(51) Int. Cl.
*G01N 21/00*    (2006.01)
(52) U.S. Cl. ................................... 356/237.5
(58) Field of Classification Search ... 356/237.2–237.6; 382/149, 141; 348/125
See application file for complete search history.

(56) References Cited

U.S. PATENT DOCUMENTS

| | | | | |
|---|---|---|---|---|
| 5,274,713 | A | * | 12/1993 | Chang et al. ................ 382/141 |
| 5,365,596 | A | * | 11/1994 | Dante et al. ................. 382/141 |
| 5,917,934 | A | * | 6/1999 | Chiu et al. .................. 382/149 |
| 5,917,935 | A | * | 6/1999 | Hawthorne et al. ......... 382/149 |
| 6,154,561 | A | * | 11/2000 | Pratt et al. .................. 382/141 |
| 6,922,482 | B1 | * | 7/2005 | Ben-Porath ................. 382/149 |
| 2003/0113007 | A1 | * | 6/2003 | Iwasaki et al. .............. 382/141 |
| 2004/0213449 | A1 | * | 10/2004 | Safaee-Rad et al. ......... 382/141 |

FOREIGN PATENT DOCUMENTS

| | | |
|---|---|---|
| JP | 10-300447 A | 11/1998 |
| WO | WO 98/45800 A1 | 10/1998 |
| WO | WO 01/41068 A1 | 6/2000 |

* cited by examiner

*Primary Examiner*—Tarifur R. Chowdhury
*Assistant Examiner*—Isiaka O Akanbi
(74) *Attorney, Agent, or Firm*—Sughrue Mion, PLLC

(57) ABSTRACT

A mura defect inspecting apparatus 10 inspects the mura defect occurring in a repetitive pattern which is on a photomask 50, and which has a large number of unit patterns that are regularly arranged. The apparatus has a light receiver 13, an analyzing device 14, and an evaluating device 15. The light receiver and the analyzing device detect the mura defect occurring in the repetitive pattern of the photomask. The evaluating device compares mura defect detection data of the mura defect of the photomask which are detected by the light receiver and the analyzing device, with plural pseudo mura defect detection data, thereby evaluating the mura defect of the photomask. The pseudo mura defect detection data are correlated respectively with plural pseudo mura defects to which intensities of mura defects occurring in a predetermined repetitive pattern are allocated with being stepwisely changed, for respective kinds of the mura defects.

16 Claims, 9 Drawing Sheets

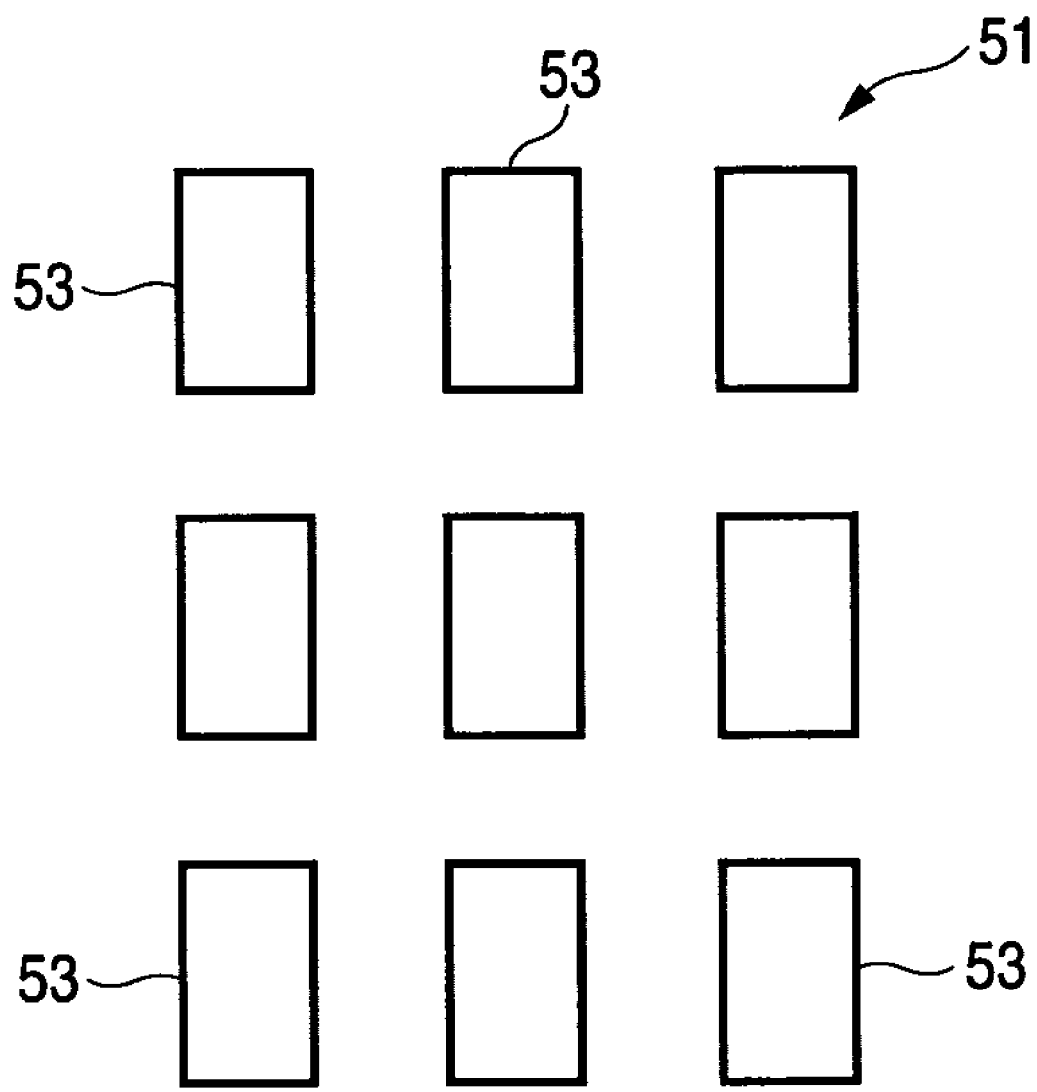

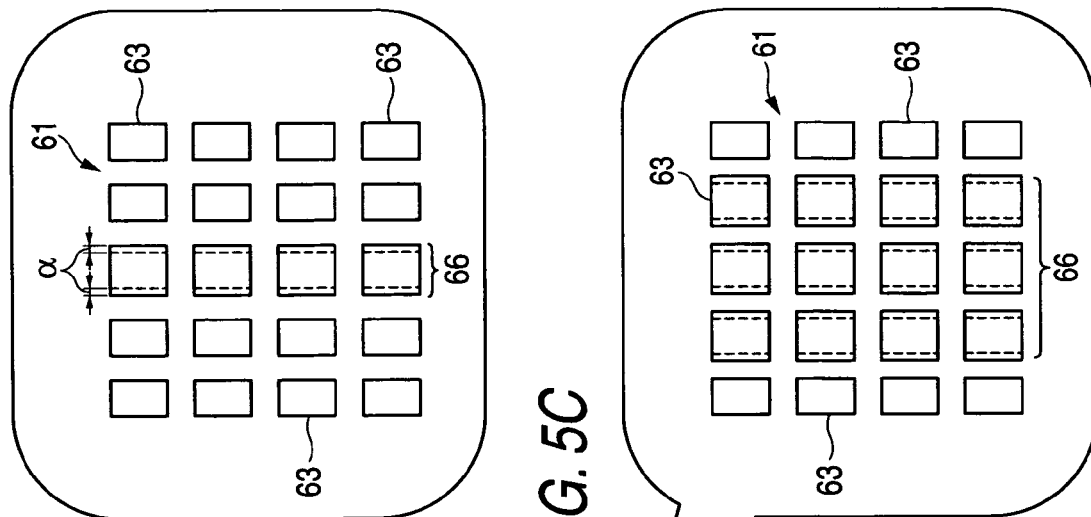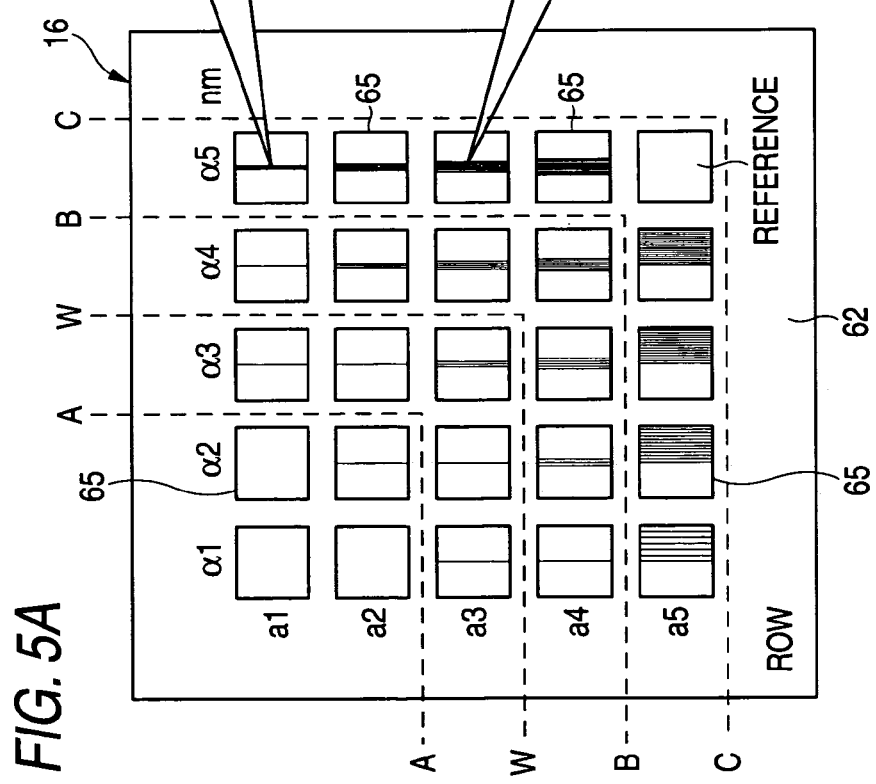
FIG. 5B
FIG. 5C
FIG. 5A

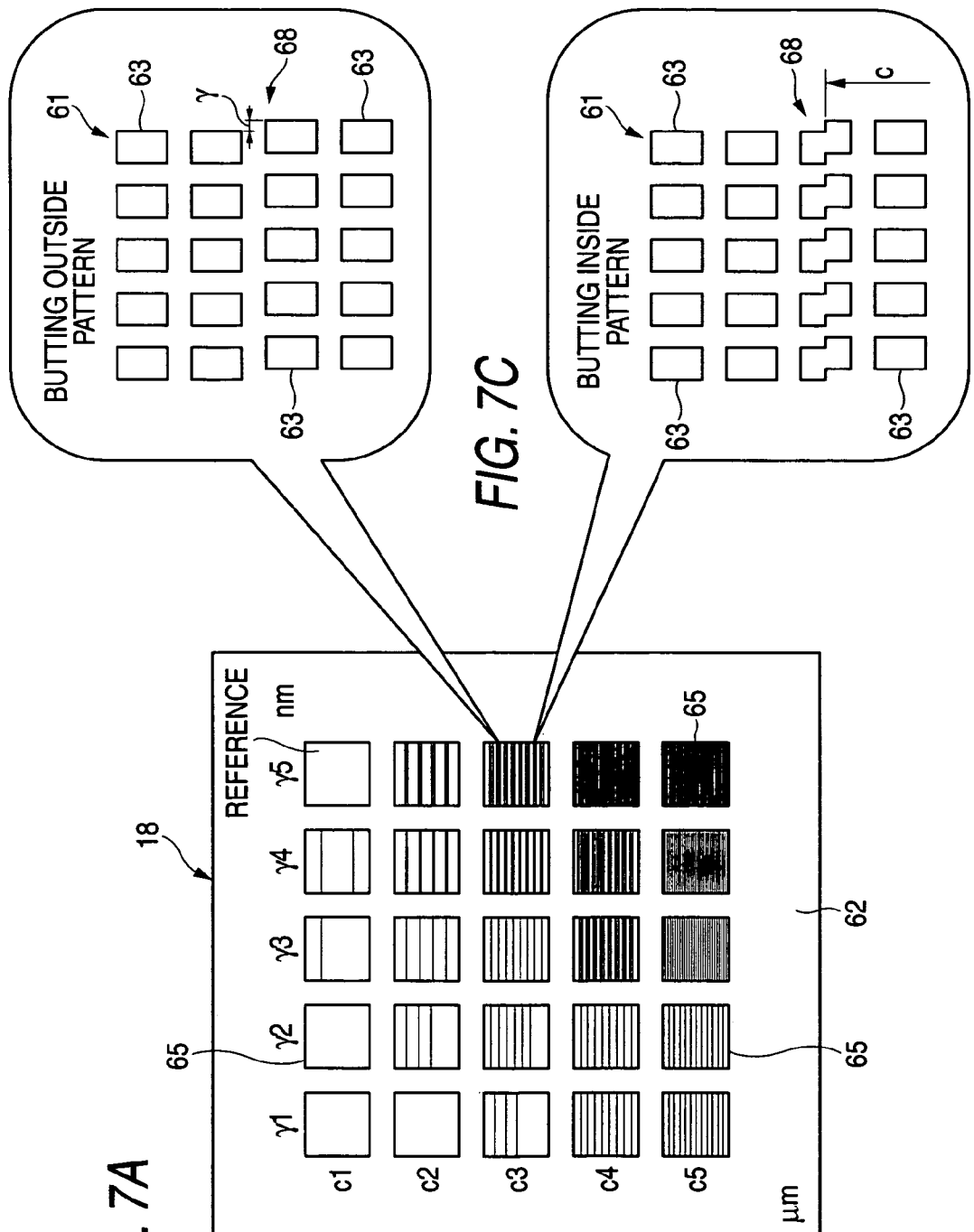

METHOD AND APPARATUS FOR INSPECTING A MURA DEFECT, AND METHOD OF MANUFACTURING A PHOTOMASK

The present invention claims foreign priority to Japanese patent application no. P.2004-159792, filed on May 28, 2004, the contents of which is incorporated herein by reference.

BACKGROUND OF THE INVENTION

1. Field of the Invention

The present invention relates to a method of inspecting the mura defect, an apparatus for inspecting the mura defect, and a method of producing a photomask.

2. Description of the Related Art

A photomask used in pattern formation in a process of producing a semiconductor device, an imaging device, or a display device has a configuration in which a opaque film made of chromium or the like is partly removed away to be formed into a desired pattern on a transparent substrate such as a glass plate.

The photomask is produced in the following method. The opaque film is formed on the transparent substrate, and a resist film is formed on the opaque film. Then, a predetermined pattern is exposed onto the resist film by conducting a writing process with using an electron beam or a laser. Thereafter, written portions and unwritten portions are selectively removed away to form a resist pattern. The opaque film is etched with using the resist pattern as a mask, to form an opaque film pattern. Finally, the residual resist is removed away, and a photomask is obtained.

Lithography apparatus which applies a writing process directly to the resist film by means of scanning with the electron beam or the laser are roughly classified into a raster scan system and a vector scan system. In the raster scan system, the beam (the electron beam or the laser) scans over the whole writing area, and, when the beam reaches a pattern portion, the beam is turned ON to draw a pattern. The beam scans in the Y-direction with a constant scan width. When the scanning operation in the Y-direction is ended, the beam is fed in the X-direction. These operations are repeated to scan the whole writing area.

On the other hand, in the vector scan system, in each of plural scanning areas (writing units), a beam scans only over a portion in which a pattern is to be formed. When a scanning operation for one pattern is ended, the beam is turned OFF, and then moved to the next portion in which a pattern is to be formed, in the same scanning area. The beam is again turned ON, and scans over the portion. When all patterns in the scanning area have been written, the beam is moved to the next scanning area by movement of an X-Y table.

When any of the above-described writing systems is employed, writing joints exist due to the beam scan width or the beam diameter, and there arises a problem in that an error due to a writing failure such as a butting error occurring in such joints is periodically caused in each of the writing units.

In a member having a repetitive pattern which is regularly arranged in accordance with a pixel pattern, for example, a photomask for producing an imaging device such as a solid-state imaging device (e.g., a CCD, a CMOS, etc.), a display device such as a liquid crystal display panel, or like image device, particularly, periodic errors, which are caused by a writing failure as described above, occur on a regular repetitive pattern. Even when each of the errors has a size which is so small as to be invisible in micro scale (for example, several tens of nm), the errors result in a continuous linear error become to be visible. As a result, a mura defect such as mura in sensitivity or that in display occurs to cause a problem in that the performance of the device is lowered. A regular error which occurs unintentionally in a regularly arranged pattern as in the above example is referred to as "mura defect."

Conventionally, the pattern demension inspection, the pattern defect inspection, and the particle inspection are usually conducted as inspections for ensuring the quality of a photomask. However, these inspections are conducted for inspecting local defects on a photomask, and hence hardly detect a defect such as the mura defect or a defect which is recognized only in a wide area on the photomask. Therefore, the mura defect is detected by a visual inspection which is subjective inspection.

On the other hand, for example, Japanese Patent Unexamined Publication JP-A-10-300447 discloses an apparatus for inspecting the mura defect in an image device substrate (for example, a TFT liquid crystal substrate). In the apparatus for inspecting the mura defect, the surface of a substrate is illuminated with light, and scattered light from an edge portion of a pattern formed on the surface is observed, thereby detecting the mura defect.

In such a visual inspection of the mura defect, however, inspection results are dispersed depending on the worker conducting the inspection. Because of this reason and the like, the mura defect of the photomask cannot be accurately detected. As a result, there is a problem in that the yield of devices is lowered.

In a device produced with using the photomask, it is considered that the mura defect of the device is caused not only by the photomask but also by other reasons such as stitch exposure of the photomask. In the apparatus for inspecting the mura defect disclosed in the JP-A-10-300447, it is difficult to identify the cause of a detected mura defect.

The apparatus for inspecting the mura defect disclosed in the JP-A-10-300447 can detect the mura defect. However, the apparatus cannot qualitatively evaluate the mura defect, and, for example, cannot differentiate the mura defect which requires an inspection from that which does not require an inspection, or quantitatively evaluate the mura defect on the basis of the intensity of the defect.

SUMMARY OF THE INVENTION

The present invention has been achieved in view of the above-discussed circumstances. One of objects of the present invention is to provide a method of inspecting the mura defect in which the mura defect occurring in a repetitive pattern of a member to be inspected can be evaluated qualitatively and quantitatively, and the mura defect can be accurately detected.

It is one of other objects of the present invention to provide an apparatus for inspecting the mura defect which can evaluate qualitatively and quantitatively the mura defect occurring in the repetitive pattern of the member to be inspected, and accurately detect the mura defect.

It is one of further objects of the present invention to provide a method of producing a photomask which enables the mura defect occurring in a repetitive pattern of a photomask to be evaluated qualitatively and quantitatively, and detected accurately.

According to a first aspect of the present invention, there is provided a method of inspecting a mura defect occurring in a repetitive pattern on a member to be inspected, the repetitive pattern having a large number of unit patterns that are regularly arranged, the method comprising the steps of:

detecting the mura defect occurring in the repetitive pattern of the member to be inspected; and evaluating the mura defect of the member to be inspected by comparing the mura defect detection data which is detected in the detecting step, with plural pseudo mura defect detection data, wherein the pseudo mura defect detection data is correlated respectively with plural pseudo mura defects to which intensities of mura defects occurring in a predetermined repetitive pattern are allocated with being stepwisely changed, for respective kinds of the mura defects.

According to a second aspect as set forth in the first aspect of the present invention, it is preferable that the pseudo mura defect detection data is obtained by detecting plural pseudo mura defects formed on a mura defect inspection mask having a predetermined repetitive pattern formed by an opaque film on a substrate, and having the plural pseudo mura defects to which intensities of mura defects occurring in the predetermined repetitive pattern are allocated with stepwisely changed, for respective kinds of the mura defects.

According to a third aspect as set forth in the first aspect of the present invention, it is preferable that in the evaluating step, an intensity of the mura defect of the member to be inspected is evaluated with using an index as a detection level, and the detection level is set in accordance with a classified intensity of the mura defect, the classified intensity defined with respect to mura defects on a device formed by transferring the repetitive pattern having the pseudo mura defect on the device.

According to a fourth aspect as set forth in the first aspect of the present invention, it is preferable that in the evaluating step, an intensity of the mura defect of the member to be inspected is evaluated with using an index as a detection threshold value, and the detection threshold value is set in accordance with an allowable intensity of the mura defect, the allowable intensity defined with respect to mura defects on a device formed by transferring the repetitive pattern having the pseudo mura defect on the device.

According to a fifth aspect as set forth in the first aspect of the present invention, it is preferable that the kinds of the mura defects are at least one of:

a CD Mura; a mura defect based on an abnormality in critical dimension of the unit patterns in the repetitive pattern;

a Pitch Mura; a mura defect based on an abnormality in interval of the unit patterns in the repetitive pattern;

a Butting Mura; a mura defect based on a positional displacement of the unit patterns in the repetitive pattern; and a Defect Mura; a mura defect based on a pattern defect of the unit patterns in the repetitive pattern.

According to a sixth aspect as set forth in the first aspect of the present invention, it is preferable that the member to be inspected is an image device, or a photomask for producing the image device.

According to a seventh aspect of the present invention, there is provided an apparatus for inspecting a mura defect occurring in a repetitive pattern on a member to be inspected, the repetitive pattern having a large number of unit patterns that are regularly arranged, the apparatus comprising:

a detecting unit for detecting the mura defect occurring in the repetitive pattern of the member to be inspected; and an evaluating unit for evaluating the mura defect of the member to be inspected by comparing mura defect detection data of the mura defect of the member to be inspected which is detected in the detecting step, with plural pseudo mura defect detection data, wherein the pseudo mura defect detection data is correlated respectively with plural pseudo mura defects to which intensities of mura defects occurring in a predetermined repetitive pattern are allocated with being stepwisely changed, for respective kinds of the mura defects.

According to an eighth aspect as set forth in the seventh aspect of the present invention, it is preferable that in the evaluating unit, a mura defect inspection mask in which plural repetitive patterns are formed on a substrate is used, each of the repetitive patterns having plural pseudo mura defects to which intensities of mura defects occurring in a predetermined repetitive pattern are allocated with being stepwisely changed, for respective kinds of the mura defects, and pseudo mura defect detection data which are correlated with the pseudo mura defects and are obtained when pseudo mura defects of the mura defect inspection mask are detected; are compared with the mura defect detection data of the mura defect of the member to be inspected which is detected by the detecting unit.

According to a ninth aspect as set forth in the seventh aspect of the present invention, it is preferable that in the evaluating unit, an intensity of the mura defect of the member to be inspected is evaluated with using an index as a detection level, and the detection level is set in accordance with a classified intensity of the mura defect, the classified intensity defined with respect to mura defects on a device formed by transferring the repetitive pattern having the pseudo mura defect is formed on the device.

According to a tenth aspect as set forth in the seventh aspect of the present invention, it is preferable that in the evaluating unit, an intensity of the mura defect of the member to be inspected is evaluated with using an index as a detection threshold value, and the detection threshold value is set in accordance with an allowable intensity of the mura defect, the allowable intensity defined with respect to mura defects on a device formed by transferring the repetitive pattern having the pseudo mura defect is formed on the device.

According to an eleventh aspect as set forth in the seventh aspect of the present invention, it is preferable that the kinds of the mura defects are at least one of:

a CD Mura; a mura defect based on an abnormality in critical dimension of the unit patterns in the repetitive pattern;

a Pitch Mura; a mura defect based on an abnormality in interval of the unit patterns in the repetitive pattern;

a Butting Mura; a mura defect based on a positional displacement of the unit patterns in the repetitive pattern; and a Defect Mura; a mura defect based on a pattern defect of the unit patterns in the repetitive pattern.

According to a twelfth aspect as set forth in the seventh aspect of the present invention, it is preferable that the member to be inspected is an image device, or a photomask for producing the image device.

According to a thirteenth aspect as set forth in the first aspect of the present invention, it is preferable that the method is used for manufacturing a photomask having a predetermined opaque film pattern on a transparent substrate, wherein the opaque film pattern is configured by a repetitive pattern in which a large number of unit patterns are regularly arranged.

The mura defect detection data of the mura defect of the repetitive pattern in the member to be inspected is compared with the plural pseudo mura defect detection data, thereby evaluating the mura defect of the member to be inspected, the pseudo mura defect detection data correlated respectively with plural pseudo mura defects to which intensities of mura defects occurring in a predetermined repetitive pattern are allocated with being stepwisely changed, for respective kinds of the mura defects. Therefore, the mura defect of the member to be inspected can be qualitatively evaluated for respective kinds of mura defects, and quantitatively evaluated in accordance with the intensity of the mura defect. Consequently, the mura defect of the member to be inspected can be accurately detected.

BRIEF DESCRIPTION OF THE DRAWINGS

FIG. 2 is a plan view showing a repetitive pattern in a chip of a photomask in FIG. 1;

FIGS. 5A to 5C are front views showing a CD Mura inspection mask used in the mura defect inspecting apparatus of FIG. 1;

FIGS. 7A to 7C are front views showing a Butting Mura inspection mask used in the mura defect inspecting apparatus of FIG. 1;

DETAILED DESCRIPTION OF THE PREFERRED EMBODIMENTS

Hereinafter, the best mode for carrying out the present invention will be described with reference to the accompanying writings.

Figure 1:
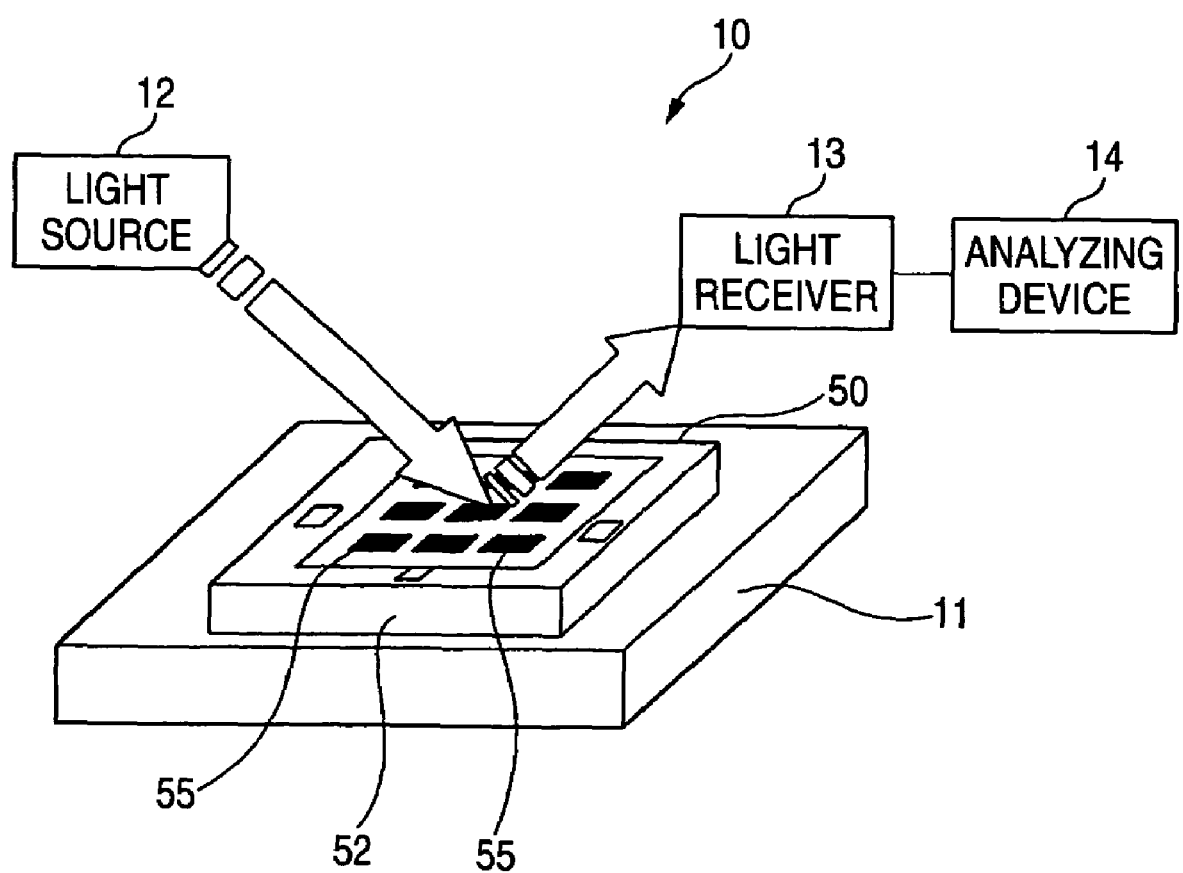
FIG. 1 is a perspective view showing the configuration of an embodiment of the apparatus for inspecting the mura defect according to the present invention.

FIG. 1 is a perspective view showing the configuration of an embodiment of an apparatus for inspecting the mura defect according to the present invention, and FIG. 2 is a plan view showing a repetitive pattern in a chip of a photomask in FIG. 1.

The mura defect inspecting apparatus 10 shown in FIG. 1 detects the mura defect occurring in a repetitive pattern 51 (FIG. 2) formed on the surface of a photomask 50 which is a member to be inspected, and is configured by a stage 11, a light source 12, a light receiver 13, an analyzing device 14, and an evaluating device 15 which serves as evaluating means. The light receiver 13 and the analyzing device 14 correspond to detecting unit. The analyzing device 14 and the evaluating device 15 are realized by identical or different personal computers. The photomask 50 is an exposure mask for producing a image device.

The image device is a device in which many pixel patterns are finally subjected to image processing or image display. Examples of such a device are an imaging device and a display device. Typical examples of the imaging device are solid state imaging devices such as a CCD, a CMOS, and a VMIS, and those of a display device are a liquid crystal display device, a plasma display device, an EL display device, an LED display device, and a DMD display device. Specifically, therefore, the pixel pattern forming an imaging face of an imaging device is a repetitive pattern forming light receiving portions of a CCD, a CMOS, or the like, and that forming a displaying face of a display device is a repetitive pattern of, for example, thin film transistors, an opposing substrate, or a color filter of a liquid crystal display device.

In the photomask 50, a opaque film made of chromium or the like is disposed on a transparent substrate 52 made of glass or the like, and the opaque film is partly removed away by the desired repetitive pattern 51 (FIG. 2). The repetitive pattern 51 is used in transferring of the many pixel pattern of the image device by the lithography method, and configured by regularly arranging unit patterns 53 in accordance with the pixel patterns. The reference numeral 55 in FIG. 1 denotes chips configured by forming the repetitive pattern 51. The chips are disposed in the number of about 5×5 in the photomask 50.

A method of producing the photomask 50 has: an opaque film pattern forming step of forming a opaque film pattern formed by the repetitive pattern 51 in which the many unit patterns 53 are regularly arranged; and the mura defect inspecting step of implementing the mura defect inspecting method with using the mura defect inspecting apparatus 10, to inspect the mura defect occurring in the repetitive pattern 51.

In the opaque film pattern forming step, first, the opaque film is formed on the transparent substrate 52, and a resist film is formed on the opaque film. Next, a pattern writing process is applied to the resist film by irradiating the film with an electron beam or a laser beam of a writing apparatus, thereby exposing the resist film a predetermined pattern. Then, written portions or unwritten portions are selectively removed away to form a resist pattern. Thereafter, the opaque film is etched with using the resist pattern as a mask, to form the repetitive pattern 51 which is configured by the many unit patterns 53. As a result, the opaque film pattern is formed.

In the opaque film pattern forming step, when the writing process is applied to the resist film by the scanning of an electron beam or a laser beam, there is a case where joints due to the beam scan width or the beam diameter occur in the writing, and an error due to a writing failure may be periodically caused in each of the writing units. This causes the occurrence of the mura defect. Typical examples of such the mura defect are a CD Mura, a Pitch Mura, a Butting Mura, and a Defect Mura.

Figure 3A:
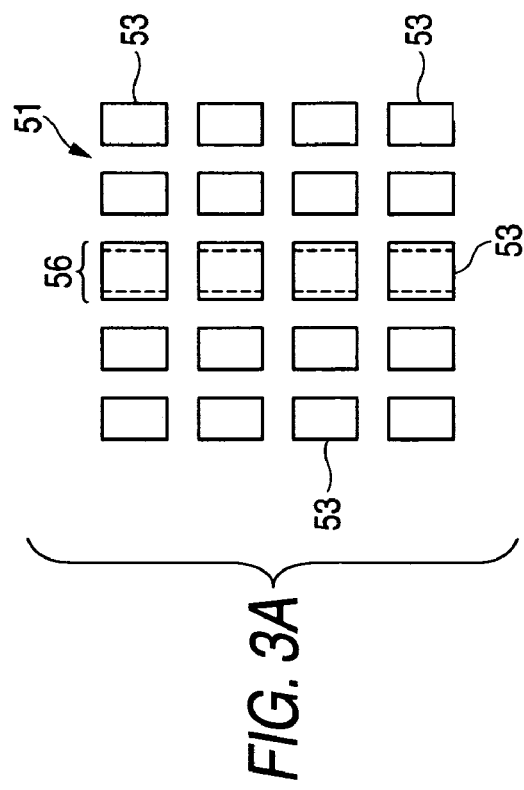
FIGS. 3A to 3D are plan views showing mura defects (CD Muras (3A, 3B) and Pitch Muras (3C, 3D)) occurring in the repetitive pattern of FIG. 2.
Figure 3B:
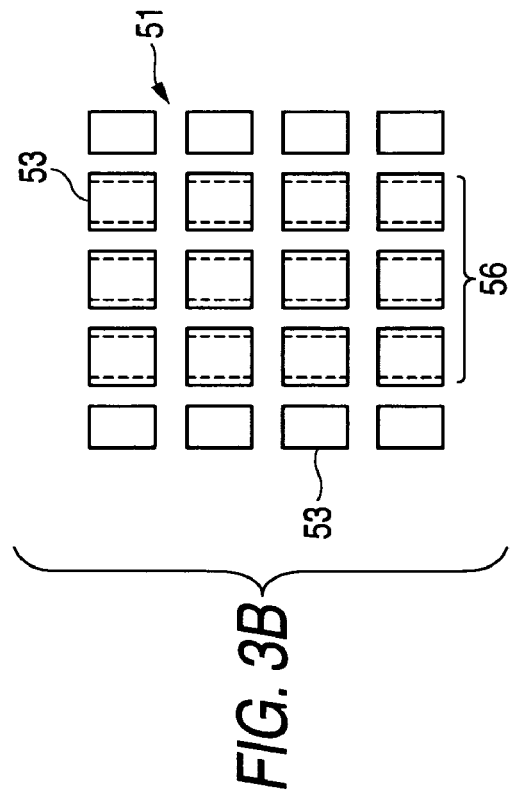

As shown in FIGS. 3A and 3B, a CD Mura 56 is based on an abnormality in critical dimension of the unit patterns 53 in the repetitive pattern 51, and caused by a phenomenon that the unit patterns 53 are thinned or thickened by variation of the beam strength of the writing apparatus.

Figure 3C:
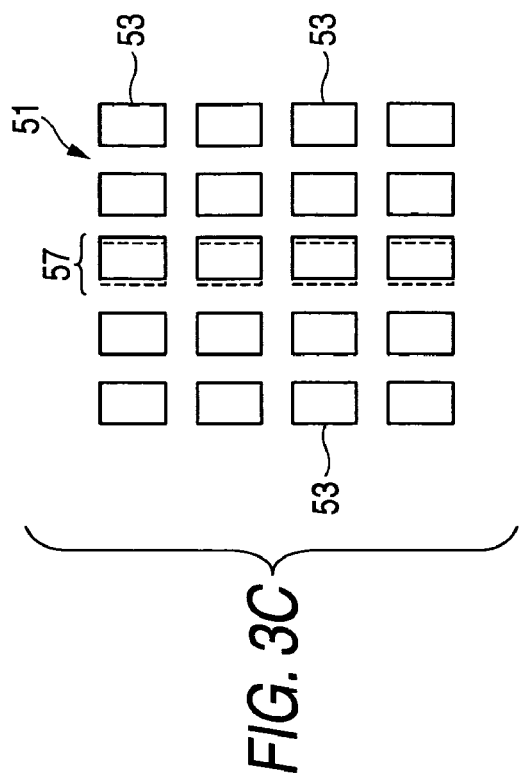
Figure 3D:
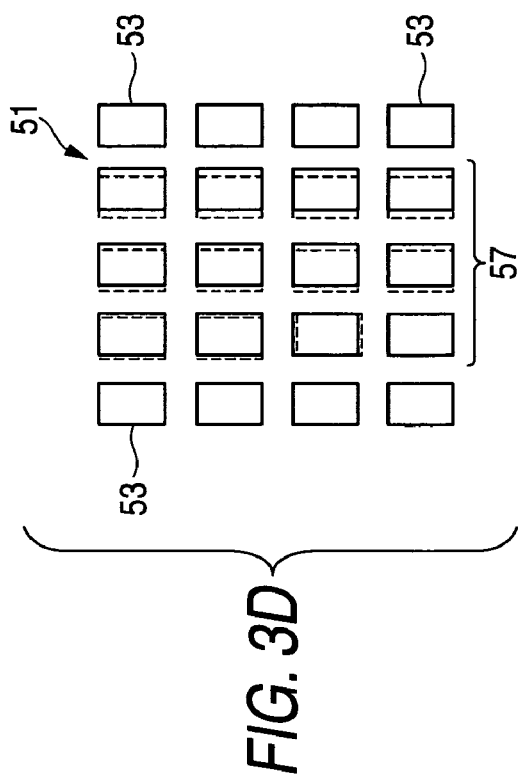

As shown in FIGS. 3C and 3D, a Pitch Mura 57 is based on an abnormality in arrangement interval of the unit patterns 53 in the repetitive pattern 51, and caused by a phenomenon that a positional displacement in a joint of writings occurs and hence the intervals of the unit patterns 53 in the repetitive pattern 51 partly differ.

Figure 4C:
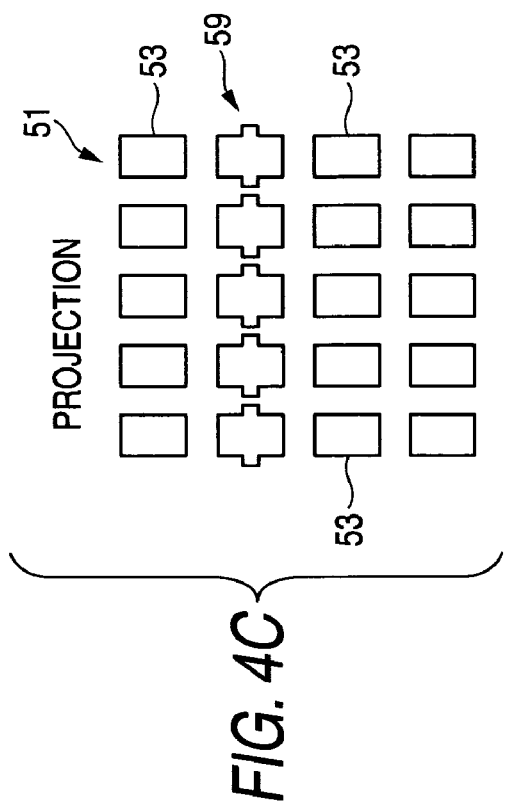
FIGS. 4A to 4D are plan view showing mura defects (Butting Muras (4A, 4B) and Defect Muras (4C, 4D)) occurring in the repetitive pattern of FIG. 2.
Figure 4D:
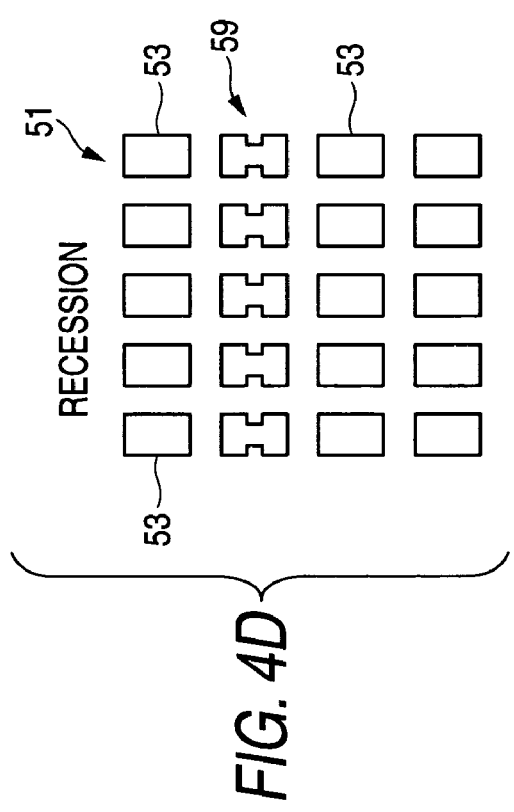
Figure 4A:
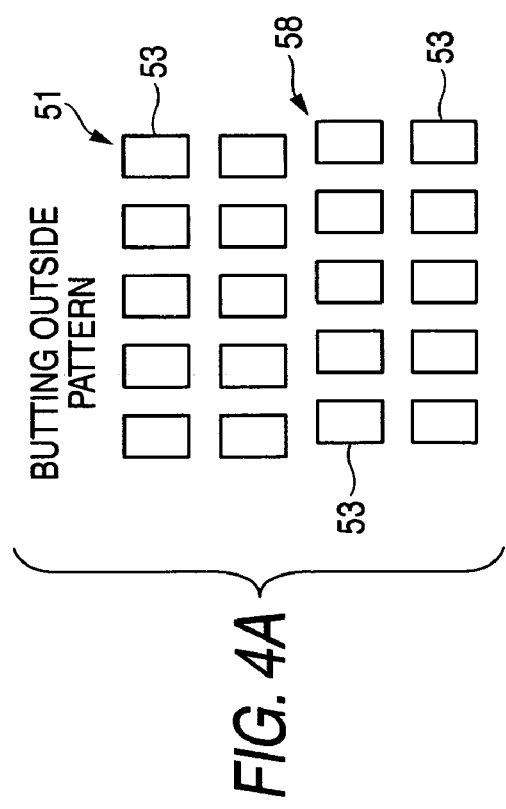
Figure 4B:
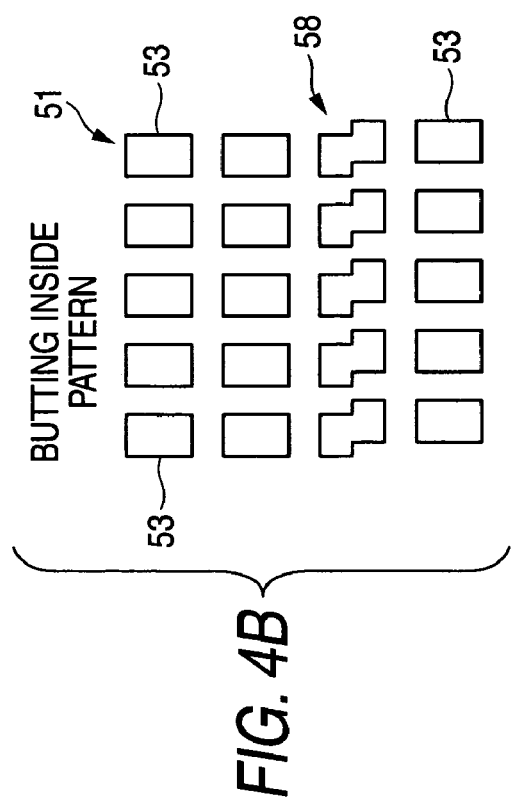

As shown in FIGS. 4A and 4B, a Butting Mura 58 is based on a positional displacement of the unit patterns 53 in the repetitive pattern 51. The Butting Mura 58 is the mura defect (outside pattern Butting Mura) caused by a phenomenon that the position of a certain unit pattern 53 in the repetitive pattern 51 is deviated with respect to another unit pattern 53 by occurrence of a positional displacement in a joint of beam writings, or the mura defect (inside pattern Butting Mura) caused by a phenomenon that deviation occurs in an identical unit pattern 53.

As shown in FIGS. 4C and 4D, a Defect Mura 59 is based on a pattern defect of the unit patterns 53 in the repetitive pattern 51, and is the mura defect (projection) caused by a phenomenon that the unit patterns 53 exist in joints of beam writings and the joints overlap with each other to cause overexposure, or the mura defect (recession) caused by a phenomenon that joints are separated from each other to cause underexposure.

The mura defect inspecting apparatus 10 shown in FIG. 1 detects the above-mentioned four typical mura defects (the CD Mura 56, the Pitch Mura 57, the Butting Mura 58, and the Defect Mura 59) which are required to be detected. The stage 11 of the mura defect inspecting apparatus 10 is a stage on which the photomask 50 is to be placed. The light source 12 is placed above one side of the stage 11, and illuminates the repetitive pattern 51 on the surface of the photomask 50 from an obliquely upper side.

The light receiver 13 is placed above the other side of the stage 11, receives reflected light from the repetitive pattern 51 of the photomask 50, particularly, scattered light from edge portions of the unit patterns 53 of the repetitive pattern 51, and converts the light to received-light data. For example, an imaging sensor such as a CCD line sensor or a CCD area sensor is used as the light receiver 13. When the mura defect occurs in the repetitive pattern 51 of the photomask 50, disturbance in regularity is caused in the received-light data converted by the light receiver. The analyzing device 14 analyzes the received-light data to produce mura defect detection data, and detects the mura defect.

In the mura defect inspecting step of the method of producing the photomask 50, the light source 12 of the mura defect inspecting apparatus 10 illuminates the repetitive pattern 51 of the photomask 50. The light receiver 13 receives light scattered by edge portions of the unit patterns 53 of the repetitive pattern 51. The analyzing device 14 analyzes the received-light data to detect the mura defect. The evaluating device 15 implements the mura defect inspecting method using the mura defect inspecting apparatus 10 in which the evaluating device 15 evaluates the mura defect as described later, thereby inspecting (detecting) the mura defect occurring in the repetitive pattern 51 of the photomask 50.

Figure 8B:
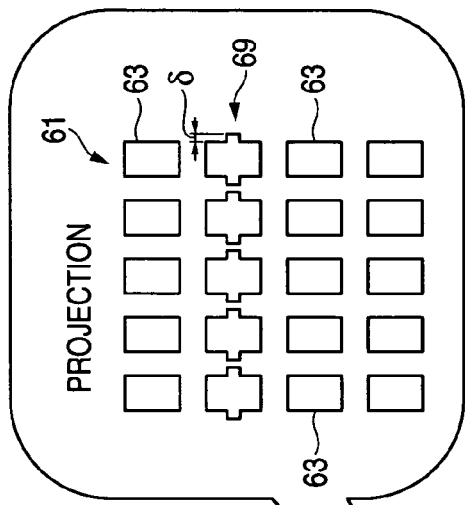
FIGS. 8A to 8C are front views showing a Defect Mura inspection mask used in the mura defect inspecting apparatus of FIG. 1.
Figure 8C:
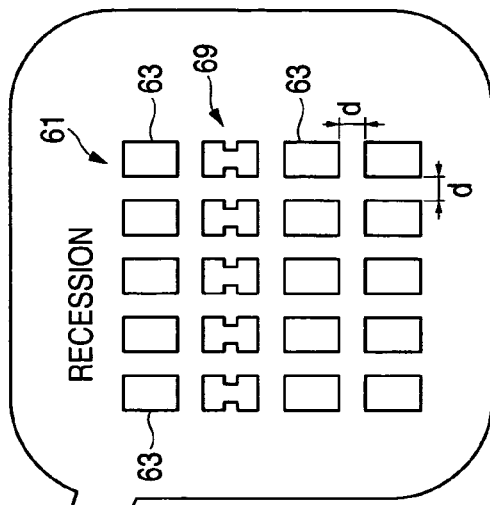
Figure 8A:
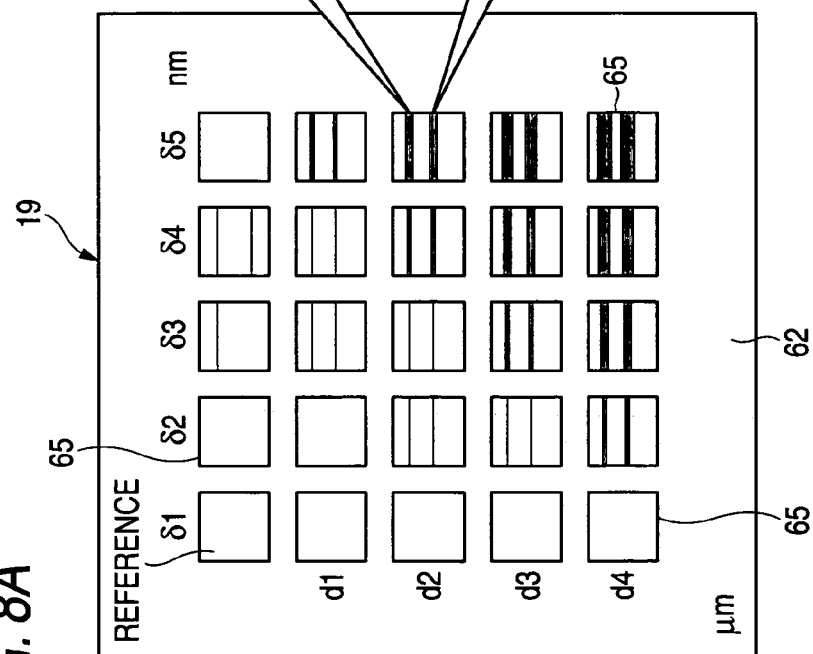
Figure 9A:
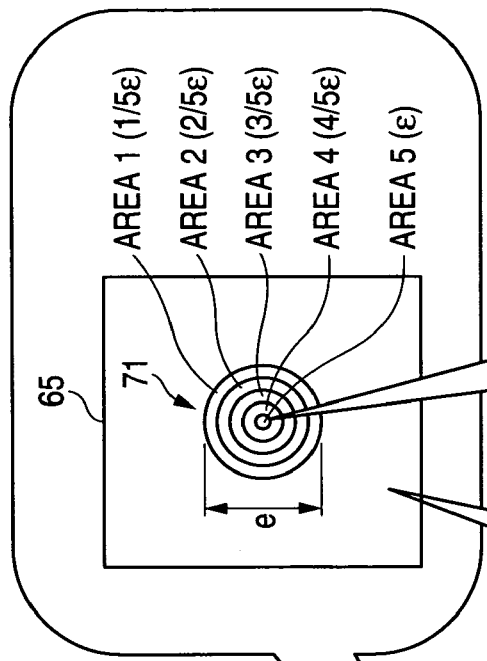
FIGS. 9A to 9D are front views showing a CD Mura inspection mask used in the mura defect inspecting apparatus of FIG. 1.
Figure 9B:
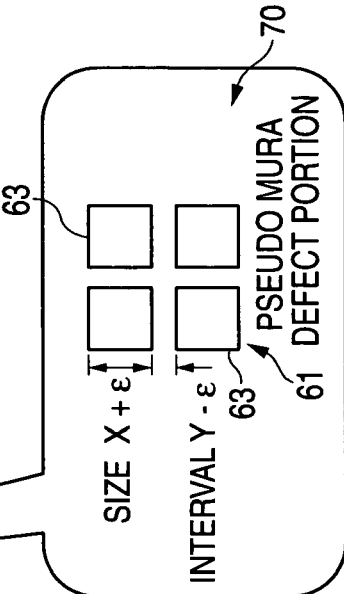
Figure 9C:
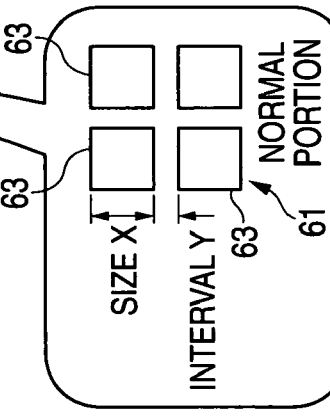
Figure 9D:
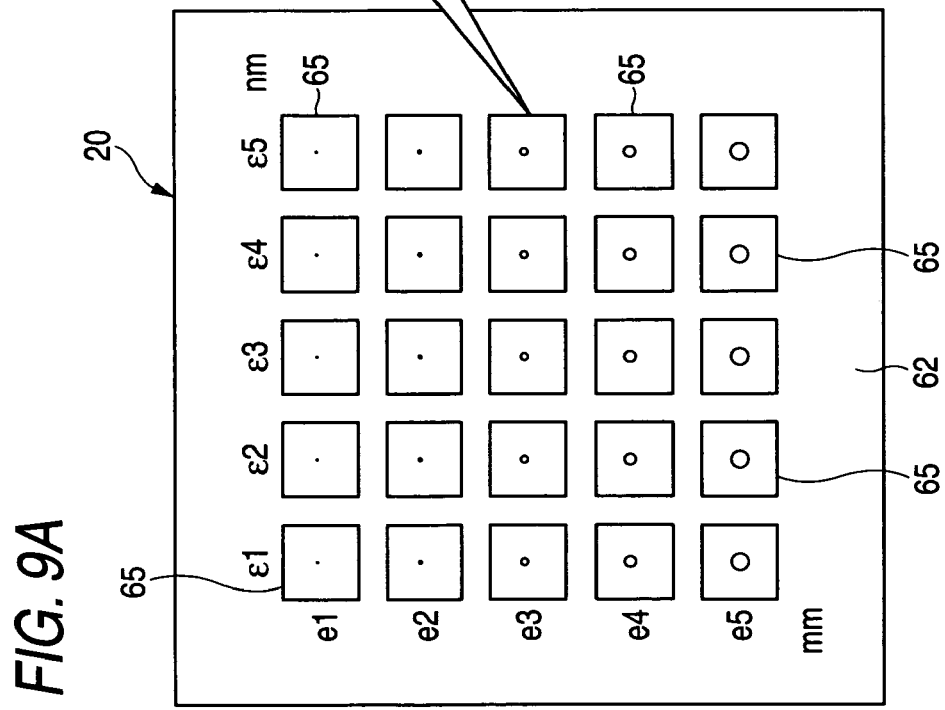

The detection sensitivity of the mura defect inspecting apparatus 10, which is determined by the light receiver 13 and the analyzing device 14, is ascertained whether it is adequate or not, by detecting pseudo mura defects 66, 67, 68, 69 in mura defect inspection masks 16, 17, 18, 19 shown in FIGS. 5 to 8 by the mura defect inspecting apparatus 10. When the detection sensitivity is not adequate, the detection sensitivity is adjusted after the ascertainment so as to be adequate. The mura defect inspection masks are a CD Mura inspection mask 16 (FIG. 5), a Pitch Mura inspection mask 17 (FIG. 6), a Butting Mura inspection mask 18 (FIG. 7), and a Defect Mura inspection mask 19 (FIG. 8).

Each of the mura defect inspection masks 16, 17, 18, 19 is configured by forming chips 65 on a transparent substrate 62. In the chips 65, for each of kinds of mura defects which may occur in predetermined repetitive patterns, plural repetitive patterns 61 each having plural pseudo mura defects 66, 67, 68, or 69 to which intensities of the mura defect are allocated with being stepwisely changed are formed. The repetitive patterns 61 are formed in a opaque film made of chromium of the like on the transparent substrate 62.

The CD Mura inspection mask 16 shown in FIG. 5 is the mura defect inspection mask in which the CD Mura 56 that is shown in FIGS. 3A and 3B and required to be detected is produced in a pseudo manner. In the CD Mura inspection mask 16, plural chips 65 each comprising a repetitive pattern 61 in which many unit patterns 63 are arranged are transversally and longitudinally placed on the transparent substrate 62. The pseudo mura defects 66 in which the change amounts α in line width of the unit patterns 63 in the repetitive patterns 61 are varied (widened) respectively to α1, α2, α3, α4, and α5 (α1<α2<α3<α4<α5, unit: nm) are inserted in the chips 65 which are transversally placed.

The pseudo mura defects 66 in which the number of insertion rows (insertion areas) is stepwisely changed (increased) to a1, a2, a3, a4, and a5 (a1<a2<a3<a4<a5) are inserted in the chips 65 which are longitudinally placed. Because of the differences of the sizes α1, α2, α3, α4, and α5 and numbers of the insertion rows a1, a2, a3, a4, and a5 of the pseudo mura defects 66, the intensities of the pseudo mura defects 66 in the CD Mura inspection mask 16 are allocated with being stepwisely changed. For example, square of the insertion rows when their numbers are a5 may be taken one third of or a half of square of each chips 65.

Figure 6B:
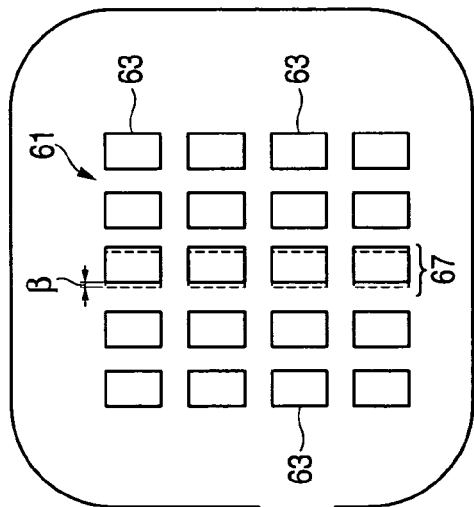
FIGS. 6A to 6C are front views showing a Pitch Mura inspection mask used in the mura defect inspecting apparatus of FIG. 1.
Figure 6C:
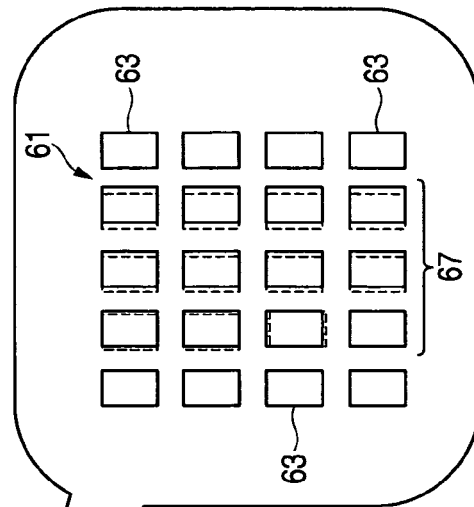
Figure 6A:
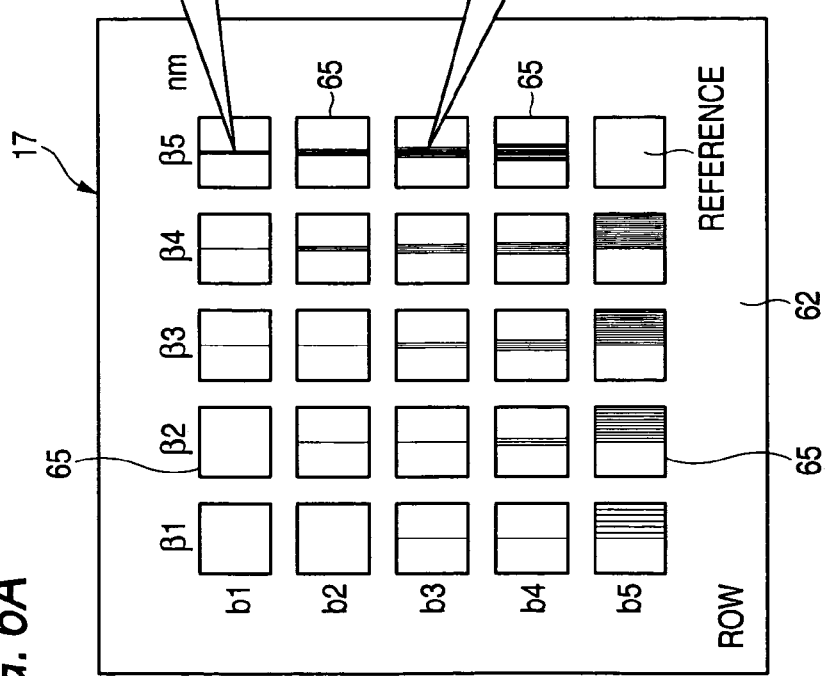

The Pitch Mura inspection mask 17 shown in FIG. 6 is the mura defect inspection mask in which the Pitch Mura 57 that is shown in FIGS. 3C and 3D and required to be detected is produced in a pseudo manner. In the Pitch Mura inspection mask 17 also, plural chips 65 each comprising a repetitive pattern 61, in which many unit patterns 63 are arranged, are transversally and longitudinally placed on the transparent substrate 62. The pseudo mura defects 67 in which the arrangement interval deviation amounts β of the unit patterns 63 in the repetitive patterns 61 are stepwisely varied respectively by β1, β2, β3, β4, and β5 (β1<β2<β3<β4<β5, unit: nm) are inserted in the chips 65 which are transversally placed.

The pseudo mura defects 67 in which the number of insertion rows (insertion areas) is stepwisely changed (increased) to b1, b2, b3, b4, and b5 (b1<b2<b3<b4<b5) are inserted in the chips 65 which are longitudinally placed. Because of the differences of the sizes β1, β2, β3, β4, and β5 and insertion row numbers b1, b2, b3, b4, and b5 of the pseudo mura defects 67, the intensities of the pseudo mura defects 67 in the Pitch Mura inspection mask 17 are allocated with being stepwisely changed. For example, square of the insertion rows when their numbers are b5 may be taken one third of or a half of square of each chips 65.

The Butting Mura inspection mask 18 shown in FIG. 7 is the mura defect inspection mask in which the Butting Mura 58 that is shown in FIGS. 4A and 4B and required to be detected is produced in a pseudo manner. In the Butting Mura inspection mask 18 also, plural chips 65 each comprising a repetitive pattern 61, in which many unit patterns 63 are arranged, are transversally and longitudinally placed on the transparent substrate 62. The outside pattern butting pseudo mura defects 68 are inserted in the upper half of each chip 65, and the inside pattern butting pseudo mura defects 68 are inserted in the lower half of each chip 65. For each of the outside and inside pseudo mura defects 68, the pseudo mura defects 68 in which the positional displacement amounts γ of the unit patterns 63 in the repetitive patterns 61 are stepwisely varied respectively to γ1, γ2, γ3, γ4, and γ5 (γ1<γ2<γ3<γ4<γ5, unit: nm) are inserted in the chips 65 which are transversally placed.

The outside and inside pseudo mura defects 68 in which the period c of insertion into the repetitive patterns 61 is stepwisely changed (the intervals between pseudo mura defects are decreased) to c1, c2, c3, c4, and c5 (c1>c2>c3>c4>c5) are inserted in the chips 65 which are longitudinally placed. Because of the differences of the sizes γ1, γ2, γ3, γ4, and γ5 and insertion periods c1, c2, c3, c4, and c5 of the pseudo mura defects 68, the intensities of the pseudo mura defects 68 in the Butting Mura inspection mask 18 are allocated with being stepwisely changed.

The Defect Mura inspection mask 19 shown in FIG. 8 is the mura defect inspection mask in which the Defect Mura 59 that is shown in FIGS. 4C and 4D and required to be detected is produced in a pseudo manner. In the Defect Mura inspection mask 19 also, plural chips 65 each comprising a repetitive pattern 61 in which many unit patterns 63 are arranged are transversally and longitudinally placed on the transparent substrate 62. Two rows respectively having projections and recessions which are pattern defects of the unit patterns 63 are transversally inserted in each chip 65. The pseudo mura defects 69 in which the size δ of each of the projections and the recessions are stepwisely varied (increased) respectively by δ1, δ2, δ3, δ4, and δ5 (δ1<δ2<δ3<δ4<δ5, unit: nm) are inserted in the chips 65 which are transversally placed.

In consideration that the reflectivity affects the Defect Mura 59, the interval d of the unit patterns 63 is set to be stepwisely changed (reduced) to d1, d2, d3, and d4 (d1>d2>d3>d4, unit: μm), in the chips 65 which are longitudinally placed. Because of the difference of the sizes δ1, δ2, δ3, δ4, and δ5 of the projections and the recessions in the pseudo mura defects 69, and those of the distance d1, d2, d3, and d4 in the unit patterns 63, the intensities of the pseudo mura defects 69 in the Defect Mura inspection mask 19 are allocated with being stepwisely changed.

The above-described mura defect inspection masks have pseudo mura defects which simulate the mura defects occurring mainly by a writing failure. Mura defect inspection masks which simulate CD Muras due to development of the resist and etching of the opaque film may be added.

The CD Mura due to development of the resist and etching of the opaque film are caused mainly by phenomenon that, for example, the wettability of a processed substrate with respect to a developer and an etchant is partly different, and a CD error occurs in the portion.

The CD Mura inspection mask 20 shown in FIG. 9 is the mura defect inspection mask in which a CD error due to development of the resist and etching of the opaque film is produced in a pseudo manner. In the CD Mura inspection mask 20 also, plural chips 65 comprising a repetitive pattern 61 in which many unit patterns 63 are arranged are transversally and longitudinally placed on the transparent substrate 62.

A pseudo mura defect 70 is inserted in each of the chips 65 which are transversally arranged. The pseudo mura defect 70 is produced in a middle circular area 71 in a pattern 61. In the circular area 71, the dimension X (i.e., the line width) of a unit pattern 63 is changed without changing the center position of the unit pattern 63, and the total change amount ε of the line width is varied by ε1, ε2, ε3, ε4, and ε5 (ε1<ε2<ε3<ε4<ε5, unit: nm). The circular area 71 has five areas (area 1 to area 5) which are formed by equally dividing into five parts in the radial direction. The line width is changed so that the width change amount is stepwisely increased by an equal distance from area 1 toward area 5, and the greatest change amount (the change amount of area 5) is equal to the total change amount ε.

The diameter e of the circular area 71 is set to e1, e2, e3, e4, and e5 (e1<e2<e3<e4<e5) with being stepwisely changed (increased), in the chips 65 which are longitudinally placed. Because of the difference of the width change amounts in the circular areas 71 for causing the pseudo mura defects 70 in the repetitive patterns 61, and that of the sizes (diameters e) of the circular areas 71, the intensities of the pseudo mura defects 67 in the CD Mura inspection mask 20 are allocated with being stepwisely changed.

The evaluating device 15 of the mura defect inspecting apparatus 10 shown in FIG. 1 evaluates qualitatively and quantitatively the mura defect which occurs in the repetitive pattern 51 (FIG. 2) of the photomask 50, and which is detected by the light receiver 13 and the analyzing device 14.

The evaluating device 15 first identifies the CD Mura 56 (FIG. 3), the Pitch Mura 57, the Butting Mura 58 (FIG. 4), the Defect Mura 59 which seem to occur in the writing step on the resist film in the process of producing the photomask 50, and a CD Mura which is caused by development of the resist and etching of the opaque film (hereinafter, such a CD Mura is referred to as "development/etching CD Mura"), as the kinds of mura defects which are required to be inspected by the mura defect inspecting apparatus 10. The CD Mura inspection mask 16 (FIG. 5), the Pitch Mura inspection mask 17 (FIG. 6), the Butting Mura inspection mask 18 (FIG. 7), the Defect Mura inspection mask 19 (FIG. 8), and the CD Mura inspection mask 20 (FIG. 9) in which the mura defects are produced in a pseudo manner as described above are prepared. Next, the evaluating device 15 obtains pseudo mura defect detection data when the pseudo mura defects 66, 67, 68, 69, 70 of the CD Mura inspection mask 16, the Pitch Mura inspection mask 17, the Butting Mura inspection mask 18, the Defect Mura inspection mask 19, and the CD Mura inspection mask 20 are detected by the mura defect inspecting apparatus 10. The pseudo mura defect detection data are stored with being correlated with each of the pseudo mura defect 66 of the CD Mura inspection mask 16, the pseudo mura defect 67 of the Pitch Mura inspection mask 17, the pseudo mura defect 68 of the Butting Mura inspection mask 18, the pseudo mura defect 69 of the Defect Mura inspection mask 19, and the pseudo mura defect 70 of the CD Mura inspection mask 20.

Then, the evaluating device 15 compares the mura defect detection data of the mura defect of the photomask 50 which are detected by the light receiver 13 and the analyzing device 14, with the pseudo mura defect detection data which are stored as described above, identifies the kind of the mura defect (the CD Mura 56, the Pitch Mura 57, the Butting Mura 58, the Defect Mura 59, the development/etching CD Mura, or the mura defect other than these mura defects) to qualitatively evaluate the mura defect, and determines the intensity of the mura defect to quantitatively evaluate the mura defect.

Specifically, the evaluating device 15 evaluates the intensity of the mura defect with using detection levels A, B, and C, or a detection threshold W which are set in the mura defect inspection masks 16, 17, 18, 19, 20.

The detection levels A, B, and C are set with, when a transferred pattern to which the repetitive patterns 61 are transferred is formed on a image device, using classified intensities of predetermined mura defects for the image device. The repetitive patterns 61 have the pseudo mura defects 66, 67, 68, 69, 70 respectively in the CD Mura inspection mask 16, the Pitch Mura inspection mask 17, the Butting Mura inspection mask 18, the Defect Mura inspection mask 19, and the CD Mura inspection mask 20.

For example, the detection levels A, B, and C are set in the following manner. In the CD Mura inspection mask 16 shown in FIG. 5, the intensity of the pseudo mura defects 66 in which the sizes are α1 and α2 and the numbers of insertion rows in ranks a1 and a2 is set as the detection level A. The intensity of the pseudo mura defects 66 in which the sizes are α3 and α4 and the numbers of insertion rows in the ranks a3 and a4 is set as the detection level B. The intensity of the pseudo mura defects 66 in which the size is α5 and the number of insertion rows is a5 is set as the detection level C. In the same manner as the above-mentioned case of the CD Mura inspection mask 16, the detection levels A, B, and C are set with respect to the Pitch Mura inspection mask 17, the Butting Mura inspection mask 18, the Defect Mura inspection mask 19, and the CD Mura inspection mask 20.

The evaluating device 15 compares the mura defect detection data of the mura defect (the CD Mura 56, the Pitch Mura 57, the Butting Mura 58, the Defect Mura 59, or the development/etching CD Mura) of the photomask 50 which are detected by the light receiver 13 and the analyzing device 14, with the pseudo mura defect detection data correlated with the pseudo mura defects 66, 67, 68, 69, 70 respectively in the CD Mura inspection mask 16, the Pitch Mura inspection mask 17, the Butting Mura inspection mask 18, the Defect Mura inspection mask 19, and the CD Mura inspection mask 20. The evaluating device judges and evaluates the detected intensity of the CD Mura 56, the Pitch Mura 57, the Butting Mura 58, the Defect Mura 59, or the development/etching CD Mura, with using the detection levels A, B, and C as indices.

When the detected intensity of the CD Mura 56, the Pitch Mura 57, the Butting Mura 58, the Defect Mura 59, or the development/etching CD Mura is within the detection level A, the evaluating device 15 judges the mura defect to be in the detection level A. When the intensity is larger than the detection level A and within the detection level B, the mura defect is judged to be in the detection level B, and, when the intensity is larger than the detection level B and within the detection level C, the mura defect is judged to be in the detection level C.

The detection threshold W is set with, when a transferred pattern to which the repetitive patterns 61 are transferred is formed on a image device, using allowable intensities of predetermined mura defects for the image device as a reference. The repetitive patterns 61 have the pseudo mura defects 66, 67, 68, 69, 70 respectively in the CD Mura inspection mask 16, the Pitch Mura inspection mask 17, the Butting Mura inspection mask 18, the Defect Mura inspection mask 19, and the CD Mura inspection mask 20. For example, the detection threshold W is set in the following manner. In the CD Mura inspection mask 16 shown in FIG. 5, the size of the pseudo mura defect 66 is set between α3 and α4, and the number of insertion rows of the pseudo mura defect 66 is set between a3 and a4. In the same manner as the above-mentioned case of the CD Mura inspection mask 16, the detection threshold W is set with respect to the Pitch Mura inspection mask 17, the Butting Mura inspection mask 18, the Defect Mura inspection mask 19, and the CD Mura inspection mask 20.

The evaluating device 15 compares the mura defect detection data of the mura defect (the CD Mura 56, the Pitch Mura 57, the Butting Mura 58, the Defect Mura 59, or the development/etching CD Mura) of the photomask 50 which are detected by the light receiver 13 and the analyzing device 14, with the pseudo mura defect detection data correlated with the pseudo mura defects 66, 67, 68, 69, 70 respectively in the CD Mura inspection mask 16, the Pitch Mura inspection mask 17, the Butting Mura inspection mask 18, the Defect Mura inspection mask 19, and the CD Mura inspection mask 20. The evaluating device judges the detected intensity of the CD Mura 56, the Pitch Mura 57, the Butting Mura 58, the Defect Mura 59, or the development/etching CD Mura, with using the detection threshold W as an index. Namely, the detected intensity of the mura defect is evaluated in the following manner. When the intensity of the CD Mura 56, the Pitch Mura 57, the Butting Mura 58, the Defect Mura 59, or the development/etching CD Mura is smaller than the detection threshold W, the evaluating device 15 judges that "the mura defect is good," and, when the intensity is larger than the detection threshold W, the evaluating device 15 judges that "the mura defect is not good."

In the thus configured embodiment, the evaluating device 15 of the mura defect inspecting apparatus 10 evaluates the mura defect of the photomask 50 by comparing the mura defect detection data of the mura defect (the CD Mura 56, the Pitch Mura 57, the Butting Mura 58, the Defect Mura 59, the development/etching CD Mura, or the like) occurring in the repetitive pattern 51 of the photomask 50 which are detected by the light receiver 13 and the analyzing device 14, with, for each of the kinds of mura defects occurring in the predetermined repetitive patterns 61 in the mura defect inspection masks 16, 17, 18, 19, 20, the plural pseudo mura defect detection data correlated respectively with the plural pseudo mura defects 66, 67, 68, 69, 70 to which the intensities of the mura defects are allocated with being stepwisely changed. Therefore, mura defects of the photomask 50 can be qualitatively evaluated for each of the kinds of mura defects (the CD Mura 56, the Pitch Mura 57, the Butting Mura 58, the Defect Mura 59, the development/etching CD Mura, or the mura defect other than these defects). Furthermore, the mura defect can be quantitatively evaluated in accordance with the intensity of the mura defect with using, for example, the detection levels A, B, and C, or the detection threshold W. Therefore, the mura defect of the photomask 50 can be accurately detected.

The mura defect inspecting apparatus 10 detects the respective plural pseudo mura defects 66, 67, 68, 69, 70 in the mura defect inspection masks 16, 17, 18, 19, 20, whereby the detection sensitivity is ascertained or ascertained and then adjusted. In the mura defect inspecting apparatus 10, therefore, the detection sensitivity is set to a level at which the plural pseudo mura defects 66, 67, 68, 69, 70 in the mura defect inspection masks 16, 17, 18, 19, 20 can be surely detected, and hence the mura defect (the CD Mura 56, the Pitch Mura 57, the Butting Mura 58, the Defect Mura 59, or the development/etching CD Mura) occurring in the repetitive pattern 51 of the photomask 50 can be accurately detected.

In the above, the present invention has been described on the basis of the embodiment. However, the present invention is not restricted to this.

For example, it has been described that the repetition patterns 61 are formed on the each chips 65 which is partitioned each other by space. However, the repetition patterns may be formed on a continuous opaque film.

Further, pluralities of kinds of pseudo mura defects may be formed on one tip.

Furthermore, it has been described that the light receiver 13 receives scattered light from edge portions of the unit patterns 53 of the repetitive pattern 51 in the photomask 50. Alternatively, the light receiver may receive transmitted light transmitted between the unit patterns 53 of the repetitive pattern 51 of the photomask 50, particularly diffracted light diffracted at edge portions of the unit patterns 53.

In the above, the embodiment has been described in which the member to be inspected is the photomask 50, and the mura defect inspecting apparatus 10 detects the mura defect occurring in the repetitive pattern 51 in the photomask 50 for producing a image device. Alternatively, the member to be inspected may be a image device such as an imaging device or a display device. In the alternative, the mura defect inspecting apparatus 10 may detect the mura defect occurring in a pixel pattern forming an imaging face of an imaging device (specifically, a repetitive pattern forming light receiving portions of a CCD, a CMOS, or the like), or that occurring in a pixel pattern forming a displaying face of a display device (specifically, a repetitive pattern such as thin film transistors, an opposing substrate, or a color filter of a liquid crystal display device).

It has been described that the pseudo mura defects are a CD Mura, a Pitch Mura, a Butting Mura, and a Defect Mura. Alternatively, the pseudo mura defects may be other kinds of pseudo mura defects. The manner of allocating the intensities is not restricted to the embodiment.

While there has been described in connection with the preferred embodiments of the present invention, it will be obvious to those skilled in the art that various changes and modification may be made therein without departing from the present invention, and it is aimed, therefore, to cover in the appended claim all such changes and modifications as fall within the true spirit and scope of the present invention.

What is claimed is:

1. A method for inspecting a defect occurred in a repetitive pattern on a member to be inspected, the repetitive pattern having a plurality of unit patterns that are arranged in a regularity, the defect being that occurred in a plurality of said unit patterns in another regularity, the method comprising the steps of:
    detecting the defect occurring in the repetitive pattern of the member to be inspected to produce defect detection data;
    evaluating the defect detection data by comparing with pseudo mura defect detection data;
    determining whether the repetitive pattern is formed as satisfactory by the evaluation, wherein said defect detection is carried out by irradiating a light onto the repetitive pattern to generate diffraction light at an edge portion of the repetitive pattern, and receiving the diffraction light to produce defect detection data; and
    said pseudo mura defect detection data is produced by subjecting a predetermined repetitive pattern having pseudo mura defects to said light irradiation to receive the diffraction light generated at an edge portion of the predetermined repetitive pattern, said pseudo mura defect data containing defect data of a plurality of types of pseudo mura defects each with a plurality of defect intensities.

2. The method according to claim 1, wherein the pseudo mura defect detection data is produced by detecting plural pseudo mura defects formed on a defect inspecting member having the predetermined repetitive pattern formed by an opaque film on a substrate.

3. The method according to claim 2, wherein the defect occurred in the repetitive pattern on a member to be inspected comprises the defect periodically occurred among the plurality of unit patterns.

4. The method according to claim 2, wherein the defect occurred in the repetitive pattern comprises the defect caused in a pattern writing process.

5. The method according to claim 1, wherein the evaluation is carried out referring to the defect intensity levels which are established based on the limit of the defect intensity allowable for the device being manufactured by transferring the repetitive pattern.

6. The method according to claim 1, wherein the repetitive pattern comprises at least one of:
    a defect in critical dimension of the unit patterns in the repetitive pattern;
    a defect in interval of the unit patterns in the repetitive pattern;
    a defect in a positional displacement of the unit patterns in the repetitive pattern: and
    a defect in a shape of the unit patterns in the repetitive pattern.

7. The method according to claim 1, wherein the member to be inspected comprises an image device, or a photo mask for producing the image device.

8. The method of claim 1 wherein the pseudo mura defect detection data contains a plurality of data for each type of the defect, being correlated with a pseudo mura defect, to which intensities of the defect occurred in a predetermined repetitive pattern are stepwisely changed.

9. The method of claim 8 wherein the evaluation of the detection data comprises detecting a disturbance occurred in regularity in the diffraction light received from the repetitive pattern.

10. An apparatus for inspecting a defect occurring in a repetitive pattern on a member to be inspected, the repetitive pattern having a plurality of unit patterns that are arranged in a regularity, the defect being that occurred in a plurality of said unit patterns in another regularity, the apparatus comprising:
    a detector for detecting the defect occurring in the repetitive pattern of the member to be inspected for producing defect detection data; and
    an evaluating unit for evaluating the defect by comparing the defect detection data with pseudo mura defect detection data;
    wherein the detector comprises a light source for irradiating a light onto the repetitive pattern to generate diffraction light at an edge portion of the repetitive pattern, and a light receiving device for receiving the diffraction light to produce defect detection data;
    said evaluating unit comprises a memory unit to store the pseudo mura defect detection data; and
    said pseudo mura defect detection data is prepared by subjecting a predetermined repetitive pattern having pseudo mura defects to said light irradiation to receive the diffraction light generated at an edge portion of the predetermined repetitive pattern, said pseudo mura defect data containing defect data of a plurality types of pseudo mura defects each with plurality of defect intensities.

11. The apparatus according to claim 10, wherein the evaluating unit comprises a defect inspection member, said defect inspection member comprising the predetermined repetitive pattern formed on a substrate,
    wherein the repetitive pattern formed on the substrate of the defect inspection member comprises plural pseudo mura defects to which intensities of defects occurring in the predetermined repetitive pattern as being stepwisely changed are allocated for each respective kinds of the defects.

12. The apparatus according to claim 11, wherein the pseudo mura defects contained in the defect inspection member comprise at least one of:
    a defect in critical dimension of the unit patterns in the repetitive pattern;

a defect in interval of the unit patterns in the repetitive pattern;

a defect in positional displacement of the unit patterns in the repetitive pattern; and a defect in a shape of the unit patterns in the repetitive pattern.

13. The apparatus of claim 10 wherein the pseudo mura defect detection data contains a plurality of data for each type of defect, being correlated with a pseudo mura defect, to which intensities of the defect occurred in a predetermined repetitive pattern are stepwisely changed.

14. A method for manufacturing a photomask comprising:

forming a repetitive pattern containing a plurality of a unit patterns being arranged in a regularity, wherein the method further comprises a defect inspection, said defect inspection comprising:

detecting the defect occurring in the repetitive pattern of the photomask to be inspected to produce defect detection data;

evaluating the defect detection data by comparing with pseudo mura defect detection data; and determining whether the repetitive pattern is formed as satisfactory by the evaluation;

wherein said defect detection is carried out by irradiating a light onto the repetitive pattern to generate diffraction light at an edge portion of the repetitive pattern, and receiving the diffraction light to produce defect detection data; and said pseudo mura defect detection data is produced by subjecting a predetermined repetitive pattern having pseudo mura defects to said light irradiation to receive the diffraction light generated at an edge portion of the predetermined repetitive pattern, said pseudo mura defect data containing defect data of a plurality types of pseudo mura defects each with a plurality of defect intensities.

15. A pattern defect inspection member which comprises a predetermined repetitive pattern formed on a substrate, so that, by irradiating a light onto the predetermined repetitive pattern, generate diffraction light at edge portion of the predetermined repetitive pattern, wherein the predetermined repetitive pattern comprises plural pseudo mura defects, for generating pseudo mura defect detection data, to which intensities of defects occurring in the predetermined repetitive pattern as being stepwisely changed are allocated for each respective kinds of the defects; and said pseudo mura defect detection data is prepared by subjecting the predetermined repetitive pattern having pseudo mura defects to said light irradiation to receive the diffraction light generated at an edge portion of the predetermined repetitive pattern, said pseudo mura defect data containing defect data of a plurality types of pseudo mura defects each with plurality of defect intensities.

16. The pattern defect inspection member according to claim 15, wherein the pseudo mura defects contained in the predetermined repetitive pattern comprise at least one of:

a defect in critical dimension of the unit patterns in the predetermined repetitive pattern;

a defect in interval of the unit patterns in the predetermined repetitive pattern;

a defect in a positional displacement of the unit patterns in the predetermined repetitive pattern; and a defect in a shape of the unit patterns in the predetermined repetitive pattern.

* * * * *